(12) United States Patent
Forbes et al.

(10) Patent No.: US 6,498,362 B1
(45) Date of Patent: Dec. 24, 2002

(54) WEAK FERROELECTRIC TRANSISTOR

(75) Inventors: Leonard Forbes, Corvallis, OR (US); Kie Y. Ahn, Chappaqua, NY (US)

(73) Assignee: Micron Technology, Inc., Bosie, ID (US)

( * ) Notice: Subject to any disclaimer, the term of this patent is extended or adjusted under 35 U.S.C. 154(b) by 0 days.

(21) Appl. No.: 09/383,726

(22) Filed: Aug. 26, 1999

(51) Int. Cl.$^7$ .......................... H01L 29/76; H01L 21/00
(52) U.S. Cl. ........................ 257/295; 257/296; 438/3; 365/145
(58) Field of Search .................. 257/310, 296, 257/741, 306, 295; 365/145; 438/3

(56) References Cited

U.S. PATENT DOCUMENTS

| | | | |
|---|---|---|---|
| 4,161,038 A | 7/1979 | Wu | 365/145 |
| 5,403,788 A | 4/1995 | Nishida et al. | 501/32 |
| 5,541,871 A | 7/1996 | Nishimura et al. | 365/145 |
| 5,579,258 A | 11/1996 | Adachi | 365/145 |
| 5,635,433 A | 6/1997 | Sengupta | 501/137 |
| 5,744,374 A * | 4/1998 | Moon | 437/60 |
| 5,847,423 A | 12/1998 | Yamamichi | 257/296 |
| 5,856,688 A | 1/1999 | Lee et al. | 257/295 |
| 6,151,241 A * | 11/2000 | Hayashi et al. | 365/145 |
| 6,339,238 B1 * | 1/2002 | Lim et al. | 257/295 |

OTHER PUBLICATIONS

Onodera et al., "dielectric activity and ferroelectricity in pizoelectric semiconductor Li–doped ZnO", Jpn. J. Appl. Phys. vol. 35 (1996), pp 5160.*

(List continued on next page.)

*Primary Examiner*—Steven Loke
*Assistant Examiner*—Donghee Kang
(74) *Attorney, Agent, or Firm*—Schwegman, Lundberg, Woessner & Kluth, P.A.

(57) ABSTRACT

Field effect transistors having a ferroelectric layer overlying a gate insulator layer as well as methods of their formation and use, and devices produced therefrom. Such ferroelectric field effect transistors are suitable for use in memory devices as the polarization of the ferroelectric layer can represent distinct logic states. The polarization of the ferroelectric layer alters the threshold voltage of the field effect transistor thus producing distinctly different conductivity states through the weak ferroelectric transistor at a given gate potential depending upon the polarization. The ferroelectric layer may contain a weak ferroelectric material having spontaneous polarization values in the range of approximately 0.01 $\mu$Coulomb/cm$^2$ to 1 $\mu$Coulomb/cm$^2$. The ferroelectric layer may contain a doped zinc oxide material doped with lithium and/or magnesium. Such weak ferroelectric materials permit effective transistor operation without the need for a programming conductor interposed between the ferroelectric layer and the gate insulator layer. This is possible because effective programming voltages can be applied across the ferroelectric layer and the gate insulator layer in series without exceeding the breakdown voltage of the gate insulator layer. Furthermore, having a gate insulator layer interposed between a substrate and the ferroelectric material eliminates the undesirable surface interfaces and surface states resulting from a silicon substrate-ferroelectric interface.

44 Claims, 7 Drawing Sheets

OTHER PUBLICATIONS

Onodera et al., "ferroelectric properties in piezoelectric semiconductor ZnMO (M=Li, Mg)", Jpn. J. Appy. Phys. vol. 36 (1997), pp6008.*

Akira Onodera et al, Jpn.J.Appl.Phys., vol. 35, pp5160, 1996.*

Akira Onodera et al, Jpn.J.Appl.Phys., vol. 36, pp6008, 1997.*

Etzold, K.F., "Ferroelectric and Piezoelectric Materials", *The Electrical Engineering Handbook (computer file) : CRCnetBASE*, Chapter 49, (1999).

Han, B.M., et al., "Chopping effect on the crystallinity of ZnO films prepared by a r.f. planar magnetron sputtering method", *Thin Solid Films, 338*, pp. 265–268, (1999).

Ishiwara, H., "Proposal of a Novel Ferroelectric–Gate Field Effect Transistor with Seperated Funcations for Data read–Out Data Storage", Precision and Intelligence Laboratory, Tokyo Institute of Technology, pp. 222–223.

Kobayashi, K., et al., "Mechanism of Photoinduced Charge Transfer in Co (Li)–Doped ZnO Film", *Japanese Journal of Applied Physics, 31*, pp. L 1079–L 1082, (1992).

Nishino, J., et al., "Preparation of Zinc Oxide Films by Low–Pressure Chemical Vapor Deposition Method", *Mat. Res. Soc. Symp. Proc, 363*, pp. 219–224, (1995).

Onodera, A., et al., "Dielectric Activity and Ferroelectricity in Piezoelectric Semiconductor Li–Doped ZnO", *Jpn. J. Appl. Phys., 35*, pp. 5160–5162, (1996).

Onodera, A., et al., "Ferroelectric Properties in Piezoelectric Semiconductor Zn1– M O (M=Li, Mg)", *Jpn. J. Appl. Phys., 36*, pp. 6008–6011, (1997).

Valentini, A., et al., "Preparation and characterization of Li–doped ZnO films", *American Vacuum Society*, pp. 286–289, (1991).

* cited by examiner

WEAK FERROELECTRIC TRANSISTOR

TECHNICAL FIELD

The present invention relates generally to development of ferroelectric field effect transistors having a ferroelectric layer, and in particular to development of field effect transistors containing a layer of zinc oxide doped with lithium and/or magnesium, and memory devices and other apparatus produced therefrom.

BACKGROUND

Placing ferroelectric material between the plates of a capacitor causes the capacitor to exhibit a memory effect in the form of a charge displacement or electric displacement (D) between the plates of the capacitor. In effect, when the capacitor is charged with the field lines running in one direction across the capacitor plates, a residual electric displacement remains after the electric field (E) is removed from the capacitor plates. If an opposite electric field is applied to the capacitor plates, an opposite residual electric displacement remains. A plot of the electric displacement of a ferroelectric material between the plates of a capacitor against the applied electric field across the plates of the capacitor exhibits a classic D-E hysteresis curve 100 as shown in FIG. 1. Electric displacement is related to polarization through the expression $D=\epsilon_0 E+P$, where $\epsilon_0$ is the permittivity of free space and P is the polarization of the ferroelectric material.

The hysteresis curve 100 of FIG. 1 exhibits a spontaneous polarization. Spontaneous polarization, $P_s$, is the magnitude of polarization at the intersection of the hysteresis curve 100 with the electric displacement axis 110 (at E=0). Spontaneous polarization is thus equivalent to the electric displacement in the absence of an applied electric field and is represented by points 130 and 140, generally having equal magnitude and opposite polarity. The polarity of the spontaneous polarization is dependent on the history of the applied electric field prior to removal. The coercive field 150, $E_c$, is the magnitude of the electric field at the intersection of the hysteresis curve 100 with the electric field axis 120 (at D=0) as shown at points 160 and 170. Permittivity, $\epsilon$, is defined as the incremental change in electric displacement per unit electric field when the magnitude of the measuring field is very small compared to the coercive field 150.

Using ferroelectric material in the manufacture of memory elements for memory devices is also known in the art. Such memory devices find utilization in a variety of electronic devices and systems. By applying a coercive field across the plates of a ferroelectric capacitor to produce one polarization or another, the spontaneous polarization can represent a nonvolatile 1 or 0 in the memory element. If a ferroelectric capacitor has zero volts applied across its plates, it may be polarized as indicated by either point 130 or 140 in FIG. 1. Assuming that the polarization is at point 140, if a positive voltage is applied across the capacitor that is greater than the coercive field 150, the capacitor will conduct current and move to a new polarization at point 180. When the voltage across the capacitor returns to zero, the polarization will retain its polarity and move to point 130. If a positive voltage is applied across the capacitor when it is polarized at point 130, the capacitor will not conduct current, but will move to point 180. It can be seen that a negative potential can be used to change the polarization of a capacitor from point 130 to point 140. Therefore, points 130 and 140 can represent two logic states occurring when zero volts are applied to the capacitor and which depend upon the history of voltage applied to the capacitor. As can be seen from the foregoing description, sensing the polarization of the ferroelectric capacitor through current flow can result in a destructive read, i.e., sensing the polarization of a capacitor may reverse the polarization and thus alter the data stored on the element. Such destructive reads require that the data read from the memory element be restored to the memory element following the read operation.

Another approach has included the use of a complementary pair of metal-ferroelectric-semiconductor transistors as a memory element. Using this approach, others have formed the complementary transistor pair through the deposition of ferroelectrics directly on a silicon substrate, utilizing the ferroelectric layer as the gate insulator in the field effect transistors (FETs). The polarization of the ferroelectric layer controls the threshold voltage of the transistor, allowing non-destructive reads based on conductivity between the source and drain of the transistor. However, use of a ferroelectric layer as a gate insulator can result in undesirable surface interfaces and surface states which preclude effective transistor operation.

More recently, layered device structures have been proposed where an insulation layer is formed on a silicon substrate. A lower conductor layer is formed on the insulation layer, a ferroelectric layer is formed on the lower conductor layer and an upper conductor layer is formed on the ferroelectric layer to produce a stacked gate structure. Such devices overcome the surface interface and surface state issues of memory elements such as those having the ferroelectric layer in contact with the silicon substrate. They do so by separating the ferroelectric layer from the silicon substrate using an insulation layer in contact with the silicon substrate. However, such gate stack structures incorporate a further difficulty in that a programming conductor, i.e., the lower conductor layer, is interposed between the insulation layer and the ferroelectric layer to program the device without exceeding the breakdown voltage of the gate insulator, thus creating a conduction path through the transistor that is unnecessary for transistor operation.

Others have proposed the use of extra capacitors in the gate structure to overcome the problem of applying a large programming voltage across the gate insulator. However, these approaches introduce extra process complexity in the formation of the additional capacitors.

For the reasons stated above, and for other reasons stated below which will become apparent to those skilled in the art upon reading and understanding the present specification, there is a need in the art for improved ferroelectric transistors, methods of producing same and devices produced therefrom.

SUMMARY

One embodiment includes a field effect transistor. The field effect transistor includes a gate insulator layer overlying a substrate and a ferroelectric layer overlying the gate insulator layer. In another embodiment, the ferroelectric layer is overlying and adjacent the gate insulator layer. In a further embodiment, the ferroelectric layer is overlying the gate insulator layer without a programming conductor interposed between the ferroelectric layer and the gate insulator layer. The ferroelectric layer comprises a weak ferroelectric material having a spontaneous polarization in the range of approximately 0.01 $\mu$Coulomb/cm$^2$ to approximately 1 $\mu$Coulomb/cm$^2$. In another embodiment, the gate insulator layer and the ferroelectric layer each have a thickness, where the thickness of the ferroelectric layer is approximately 10 times the thickness of the gate insulator layer. In a further embodiment, the gate insulator layer and the ferroelectric layer each have a thickness, where the thickness of the ferroelectric layer is less than approximately 10 times the thickness of the gate insulator layer. In a still further embodiment, the gate insulator layer and the ferroelectric layer each have a thickness, where the thickness of the ferroelectric layer is less than approximately 10,000 Å and the thickness of the gate insulator layer is less than approximately 1,000 Å. In another embodiment, the gate insulator layer and the ferroelectric layer each have a thickness, where the thickness of the gate insulator layer and the ferroelectric layer are adjusted such that a programming voltage applied across the gate insulator layer and the ferroelectric layer in series is sufficient to polarize the ferroelectric layer without exceeding a breakdown voltage of the gate insulator layer.

Another embodiment includes a field effect transistor. The field effect transistor includes a gate insulator layer overlying a substrate and a ferroelectric layer overlying the gate insulator layer. The ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30. In another embodiment, the ferroelectric layer is overlying and adjacent the gate insulator layer. In a further embodiment, the ferroelectric layer is overlying the gate insulator layer without a programming conductor interposed between the ferroelectric layer and the gate insulator layer. In another embodiment, the gate insulator layer and the ferroelectric layer each have a thickness, where the thickness of the ferroelectric layer is approximately 10 times the thickness of the gate insulator layer. In a further embodiment, the gate insulator layer and the ferroelectric layer each have a thickness, where the thickness of the ferroelectric layer is less than approximately 10 times the thickness of the gate insulator layer. In a still further embodiment, the gate insulator layer and the ferroelectric layer each have a thickness, where the thickness of the ferroelectric layer is less than approximately 10,000 Å and the thickness of the gate insulator layer is less than approximately 1,000 Å. In another embodiment, the gate insulator layer and the ferroelectric layer each have a thickness, where the thickness of the gate insulator layer and the ferroelectric layer are adjusted such that a programming voltage applied across the gate insulator layer and the ferroelectric layer in series is sufficient to polarize the ferroelectric layer without exceeding a breakdown voltage of the gate insulator layer.

A further embodiment includes a method of programming a ferroelectric transistor having a gate insulator layer and a ferroelectric layer. The method includes applying a programming voltage across the gate insulator layer and the ferroelectric layer in series, wherein the programming voltage is capable of polarizing the ferroelectric layer without exceeding a breakdown voltage of the gate insulator layer. In a still further embodiment, the ferroelectric layer contains a ferroelectric material having a spontaneous polarization in the range of approximately 0.01 $\mu$Coulomb/cm$^2$ to approximately 1 $\mu$Coulomb/cm$^2$. In yet another embodiment, the ferroelectric layer contains a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30.

One embodiment includes a method of forming a field effect transistor. The method includes forming a gate insulator layer overlying a substrate, forming a ferroelectric layer overlying the gate insulator layer, forming an upper conductor layer overlying the ferroelectric layer, and patterning the gate insulator layer, the ferroelectric layer and the upper conductor layer to define a gate stack structure having sidewalls. The method further includes forming spacers on the sidewalls of the gate stack structure and forming source and drain regions in the substrate. In another embodiment, forming a ferroelectric layer overlying the gate insulator layer includes forming a ferroelectric layer overlying and adjacent the gate insulator layer. In a further embodiment, forming a ferroelectric layer overlying the gate insulator layer includes forming a ferroelectric layer overlying the gate insulator layer without a programming conductor interposed between the ferroelectric layer and the gate insulator layer.

Further embodiments of the invention include ferroelectric field effect transistors and methods of varying scope, as well as apparatus, devices, modules and systems making use of such ferroelectric field effect transistors and methods.

DETAILED DESCRIPTION OF THE EMBODIMENTS

Figure 1:
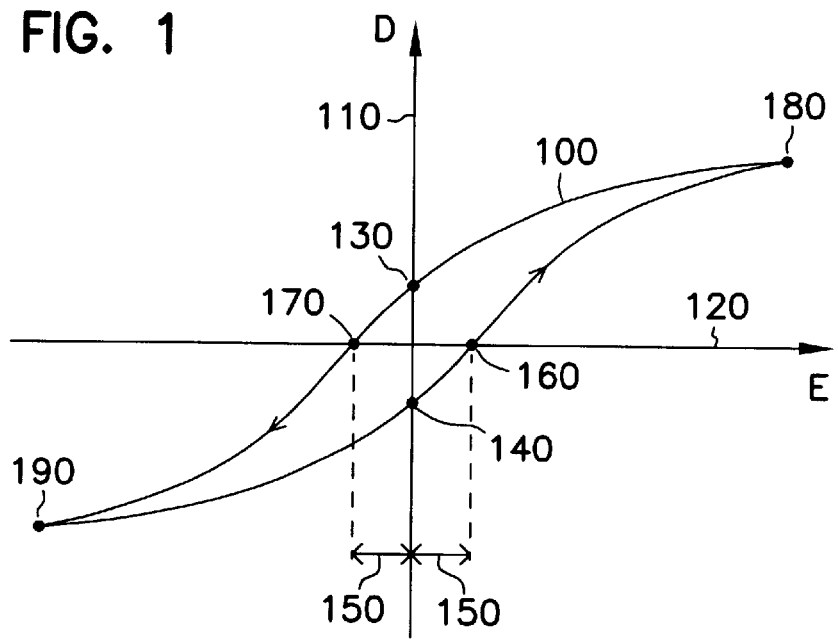
FIG. 1 is an example D-E hysteresis curve representative of a ferroelectric material.

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and their equivalents.

In one embodiment, a layer of weak ferroelectric material is formed overlying a gate insulator layer of a field effect transistor. Weak ferroelectric materials may be generally characterized by a spontaneous polarization, $P_s$, which is in the range of approximately 0.01 $\mu$Coulomb/cm$^2$ to 1 $\mu$Coulomb/cm$^2$ versus the larger values on the order of 10 $\mu$Coulomb/cm$^2$ for ordinary ferroelectrics, e.g., barium titanate (BaTiO$_3$). The polarization of the layer of weak ferroelectric material is capable of altering the threshold voltage of the field effect transistor, thus producing distinctly different conductivity states through the field effect transistor at a given gate potential depending upon the polarization. The range of spontaneous polarization may be expanded provided the resulting layer of ferroelectric material is capable of programming without exceeding a breakdown voltage of the gate insulator layer.

In a further embodiment, the weak ferroelectric material is a zinc oxide (ZnO) material doped with lithium (Li) and/or magnesium (Mg). Zinc oxide is an n-type piezoelectric II–VI semiconductor with wurtzite structure. Because of its high piezoelectricity and electromechanical coupling properties, zinc oxide found many applications in practical devices such as ultrasonic transducers, surface-acoustic-wave (SAW) devices and oxygen sensors. Although stoichiometric zinc oxide is an insulator, it usually contains excess zinc atoms, and this affects the physical properties such as electrical conductivity, piezoelectricity and defect structure. Lithium and magnesium doping of zinc oxide is known to produce ferroelectric properties in the zinc oxide material.

In one embodiment, the doped zinc oxide material is doped with lithium at a level from approximately 1 mol percent up to approximately 30 mol percent of the metal component, i.e., the doped zinc oxide material has a general formula of $Zn_xLi_{1-x}O$ where x ranges from approximately 0.70 to approximately 0.99. In another embodiment, the doped zinc oxide material is doped with magnesium at a level from approximately 1 mol percent up to approximately 30 mol percent of the metal component, i.e., the doped zinc oxide material has a general formula of $Zn_xMg_{1-x}O$ where x ranges from approximately 0.70 to approximately 0.99. In yet another embodiment, the doped zinc oxide material is doped with lithium and magnesium at a level from approximately 1 mol percent up to approximately 30 mol percent of the metal component, i.e., the doped zinc oxide material has a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30. It should be noted that in regard to the general formulae given above, there is no requirement that the oxide materials contain stoichiometric levels of oxygen, i.e., one oxygen atom for each metal atom. In fact, it is expected that there will be excess metal atoms in the oxide structure. The proportions described herein relate solely to the metal component portion of the oxide materials.

Layers of doped zinc oxide materials of the type described herein may be formed in a variety of manners known in the art. As one example, physical vapor deposition (PVD) techniques such as sputtering or laser ablation may be used to form a layer of doped zinc oxide material. Such PVD techniques may use a doped zinc oxide target having the desired composition, or a zinc oxide target in which embedded strips or particles of lithium, magnesium or both provide the desired composition upon deposition. For sputtering, the primary sputtering gas may be an inert gas such as argon (Ar), krypton (Kr) and xenon (Xe) with and without oxygen (O$_2$). As another example, jet vapor deposition of zinc oxide, lithium carbonate (Li$_2$CO$_3$) and magnesium oxide (MgO) in vacuum may be used to form a layer of doped zinc oxide. Varying the ratios of zinc oxide to lithium carbonate to magnesium oxide can be used to vary the resulting composition of the doped zinc oxide material. As yet another example, low-pressure chemical vapor deposition (LPCVD) may be used to form a layer of doped zinc oxide material.

Figure 2:
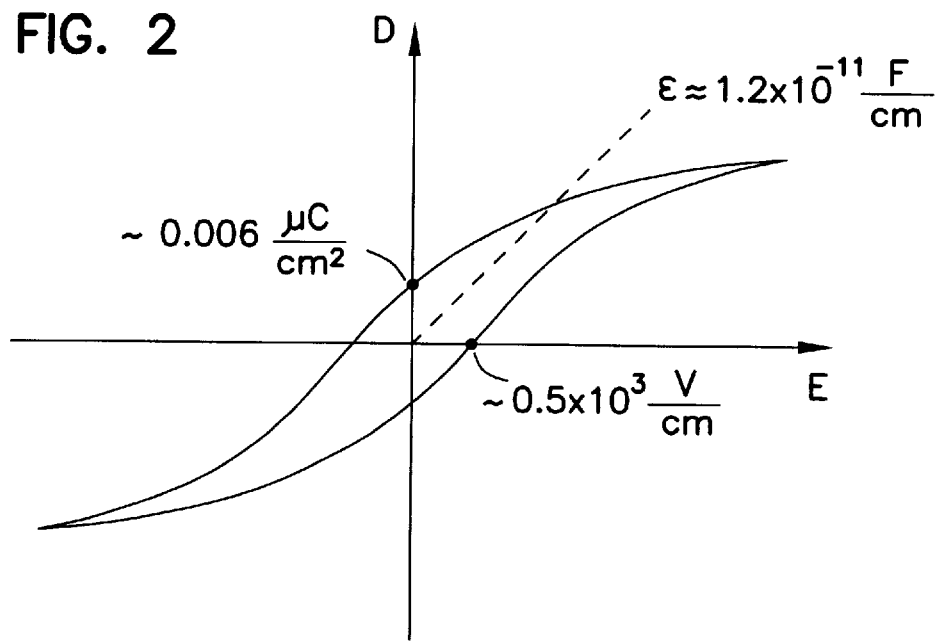
FIG. 2 is an example D-E hysteresis curve representative of a weak ferroelectric material.

FIG. 2 shows a D-E hysteresis curve representative of a weak ferroelectric material. The D-E curve is a plot of the electric displacement (D) of a ferroelectric material between the plates of a capacitor against the applied electric field (E) across the plates of the capacitor. Electric displacement is related to polarization through the expression $D=\epsilon_0E+P$, where $\epsilon_0$ is the permittivity of free space and P is the polarization of the ferroelectric material. The properties of the weak ferroelectric materials can be modified by changing the amount of impurity doping, e.g., the lithium and/or magnesium concentrations in the doped zinc oxide materials. In general, the saturation polarization value, and thus spontaneous polarization, can be reduced by lowering the concentration of these impurities.

FIG. 2 represents a D-E hysteresis curve representative of one doped zinc oxide material of the type described herein. In particular, the D-E hysteresis curve of FIG. 2 is representative of a doped zinc oxide material having a general formula of $Zn_{0.9}(Li_{0.02}Mg_{0.08})O$ as reported in literature. The D-E hysteresis curve in FIG. 2 exhibits a spontaneous polarization value of approximately 0.006 $\mu$Coulomb/cm$^2$ measured at 10 Hz at a temperature of 250K. The D-E hysteresis curve in FIG. 2 further exhibits a coercive field of approximately 0.5×10$^3$ V/cm and a permittivity of approximately 1.2×10$^{-11}$ F/cm. While FIG. 2 contains specific property values for one embodiment of a doped zinc oxide material, these values are not to be taken in a limiting sense, and the scope of the present invention is defined only by the appended claims and their equivalents. Doped zinc oxide material of the general formula $Zn_{0.83}Li_{0.17}O$ has a spontaneous polarization value of approximately 0.044 $\mu$Coulomb/cm$^2$, a coercive field of approximately 2×10$^3$ V/cm and a permittivity of approximately 2.2×10$^{-11}$ F/cm measured at 10 Hz at room temperature as reported in literature. Doped zinc oxide material of the general formula $Zn_{0.7}(Li_{0.02}Mg_{0.28})O$ has a spontaneous polarization value of approximately 0.02 $\mu$Coulomb/cm$^2$ measured at 10 Hz at room temperature as reported in literature.

Figure 3A:
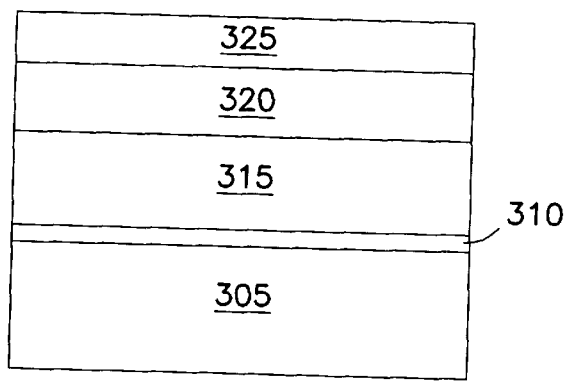
FIGS. 3A–3G are cross-sectional views of one embodiment of a ferroelectric field effect transistor at various processing stages.

FIGS. 3A–3G show an embodiment of the formation of a transistor having a ferroelectric layer, i.e., a ferroelectric field effect transistor. In FIG. 3A, a gate insulator layer 310 is formed overlying a substrate 305. In this example, substrate 305 is a P-type silicon substrate. However, N-type silicon substrates as well as other substrates may be used. Gate insulator layer 310 is a silicon oxide material in this example, such as thermally-grown silicon dioxide. Other embodiments may utilize other insulator materials, e.g., silicon nitrides and silicon oxynitrides, as well as other methods of formation. A ferroelectric layer 315 is formed overlying the gate insulator layer 310. In one embodiment, ferroelectric layer 315 has a spontaneous polarization value in the range of approximately 0.01 to 1 µCoulomb/cm$^2$. In another embodiment, ferroelectric layer 315 is overlying and adjacent gate insulator layer 310.

In one embodiment, ferroelectric layer 315 is a doped zinc oxide material. In another embodiment, ferroelectric layer 315 is a zinc oxide material doped with at least one of lithium and magnesium. In yet another embodiment, ferroelectric layer 315 is a zinc oxide material doped with lithium at a level from approximately 1 mol percent up to approximately 30 mol percent of the metal component, i.e., the doped zinc oxide material has a general formula of $Zn_xMg_{1-x}O$ where x ranges from approximately 0.70 to approximately 0.99. In a further embodiment, ferroelectric layer 315 is a zinc oxide material doped with magnesium at a level from approximately 1 mol percent up to approximately 30 mol percent of the metal component, i.e., the doped zinc oxide material has a general formula of $Zn_xMg_{1-x}O$ where x ranges from approximately 0.70 to approximately 0.99. In a still further embodiment, ferroelectric layer 315 is a zinc oxide material doped with lithium and magnesium at a level from approximately 1 mol percent up to approximately 30 mol percent of the metal component, i.e., the doped zinc oxide material has a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30. It will be repeated that in regard to the general formulae given above, there is no requirement that the oxide materials contain stoichiometric levels of oxygen, i.e., one oxygen atom for each metal atom. In fact, it is expected that there will be excess metal atoms in the oxide structure. The proportions described herein relate solely to the metal component portion of the oxide materials.

While the doped zinc oxide materials in some embodiments consist essentially of zinc, oxygen, and lithium and/or magnesium, the realities of industrial processing must be recognized. Where a reference is made to the composition of a material, the reader must remember that there will always be some incident contamination, either at the percentage, ppm, ppb or atomic level. This contamination will come from multiple sources. Some contamination is inherently found in the raw materials resulting from their source or preparation. Other contamination will enter through the processes of forming the material layers, as well as prior and subsequent processing. Acceptable levels of contamination will be dependent on the nature and needs of the process, the processing equipment and environment utilized, and the source and nature of the raw materials used. Thus, the compositions given for doped zinc oxide materials describe the relevant composition and disregard incident contamination.

Ferroelectric layer 315 may be formed by a variety of processes. In one embodiment, ferroelectric layer 315 is formed by sputtering. In another embodiment, ferroelectric layer 315 is formed by magnetron sputtering, e.g., RF-magnetron sputtering. In a further embodiment, ferroelectric layer 315 is formed by sputtering from a target containing a doped zinc oxide material of the desired composition. In a still further embodiment, the target contains a zinc oxide material with embedded strips or particles of lithium, magnesium or both. In another embodiment, ferroelectric layer 315 is formed by jet vapor deposition of zinc oxide, lithium carbonate ($Li_2CO_3$) and magnesium oxide (MgO) in vacuum. Varying the ratios of zinc oxide to lithium carbonate to magnesium oxide can be used to vary the resulting composition of the doped zinc oxide material. In yet another embodiment, ferroelectric layer 315 is formed by low-pressure chemical vapor deposition (LPCVD). In general, the embodiments are not limited by the process used to form ferroelectric layer 315 as long as it exhibits the properties described herein.

An upper conductor layer 320 is formed overlying the ferroelectric layer 315. In this example, upper conductor layer 320 is a polysilicon layer, such as conductively-doped polysilicon. In other embodiments, upper conductor layer 320 may include metals, metal silicides, conductive metal oxides, or some combination of conductive materials, e.g., a refractory metal silicide layer overlying a polysilicon layer. A protective cap layer (not shown) may be formed overlying upper conductor layer 320. Examples of protective cap layers may include silicon nitride materials.

Figure 3B:
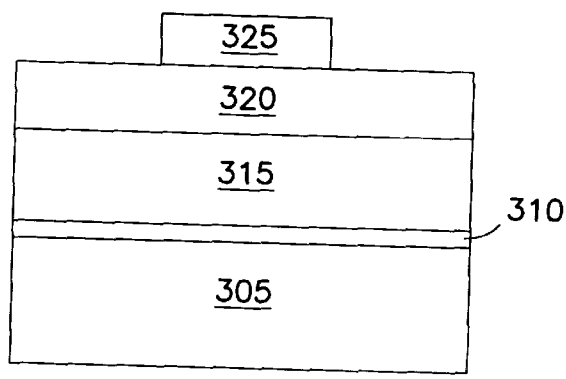
Figure 3C:
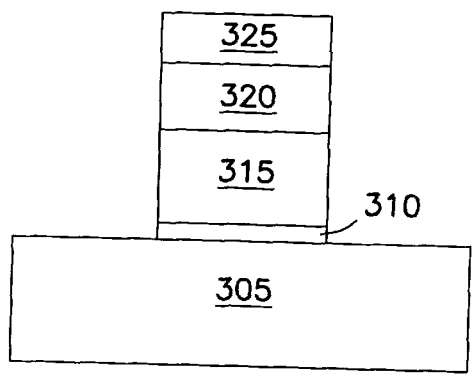
Figure 3D:
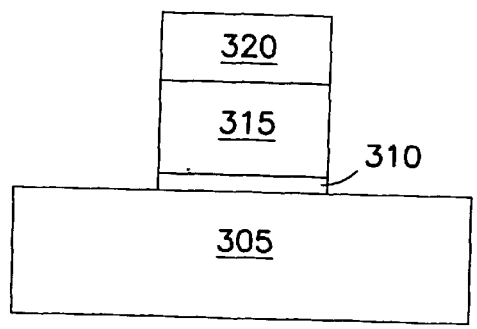

A photoresist layer 325 is formed overlying the upper conductor layer 320. In FIG. 3B, photoresist layer 325 is patterned in a manner well known in the art to define a future gate stack structure. In FIG. 3C, patterned photoresist layer 325 is used to form a gate stack structure including upper conductor layer 320, ferroelectric layer 315 and gate insulator layer 310. The gate structure can be formed by methods such as etching, using the substrate 305 as the stopping layer. The photoresist layer 325 is then removed as shown in FIG. 3D.

Figure 3E:
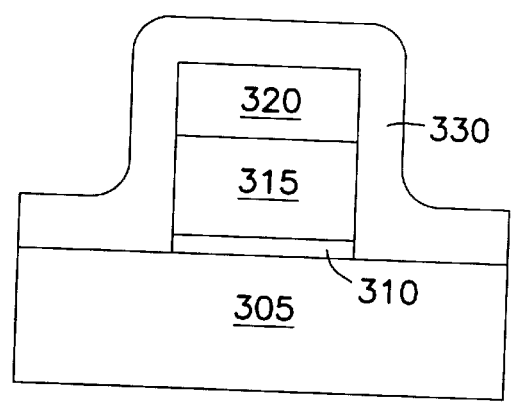
Figure 3F:
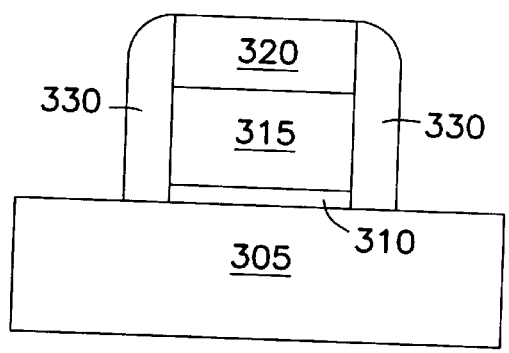
Figure 3G:
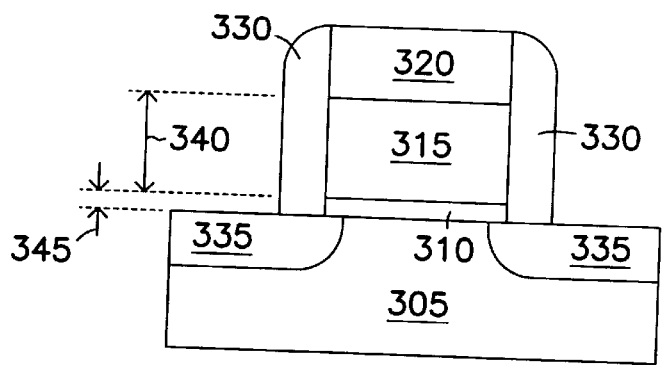

In FIG. 3E, a spacer layer 330 is formed over the resulting gate stack structure. Spacer layer 330 is generally an insulating material. Some common examples include silicon oxides, silicon nitrides and silicon oxynitrides. Portions of spacer layer 330 are then removed anisotropically to form spacers 330 as shown in FIG. 3F. Upon formation of the spacers 330, source and drain regions 335 may be formed in substrate 305 such as by ionic doping of substrate 305. In the example, where substrate 305 is a P-type silicon substrate, source and drain regions 335 would have an N-type conductivity. Obvious alterations to the conductivity of source and drain regions 335 would be required if substrate 305 had a conductivity other than P-type. Source and drain regions 335 are separated by a channel region.

Ferroelectric layer 315 should have a thickness 340 greater than the thickness 345 of the gate insulator layer 310. Thickness is generally measured in parallel to the applied electric field. In one embodiment, thickness 340 of ferroelectric layer 315 is adjusted such that ferroelectric layer 315 can be programmed, i.e., cause a change in its polarization, at an applied voltage that does not exceed the breakdown voltage of the gate insulator layer 310. In another embodiment, thickness 340 of ferroelectric layer 315 is adjusted such that ferroelectric layer 315 can be programmed, i.e., cause a change in its polarization, at an applied voltage that does not exceed the breakdown voltage of the gate insulator layer 310 and an applied voltage of less than a power supply voltage, such as $V_{DD}$. In a further embodiment, thickness 340 of ferroelectric layer 315 is less than approximately 10,000 Å and thickness 345 of gate insulator layer 310 is less than approximately 1,000 Å. Such thicknesses generally allow programming ferroelectric layer 315 at a gate voltage of approximately 1.0 V. In a still further embodiment, thickness 340 of ferroelectric layer 315 is less than or equal to approximately 10 times the thickness 345 of gate insulator layer 310.

Defining thickness 340 of ferroelectric layer 315 is a balance of the desire to increase the effect of the polarization of ferroelectric layer 315 on the threshold voltage of the transistor against the desire to utilize low programming voltages across the gate of the transistor to avoid breakdown of the gate insulator layer 310. Increasing thickness 340 of ferroelectric layer 315, and increasing permittivity of ferroelectric layer 315, tend to increase the effect of polarization on threshold voltage as well as increase the voltage drop across gate insulator layer 310 during programming.

Although the values of thickness given above are effective guidelines to produce transistors under current technological considerations, the continuing drive to produce smaller and smaller semiconductor devices and to utilize smaller operating voltages may require reducing thickness 345 of gate insulator layer 310. However, appropriate values of thickness 340 of ferroelectric layer 315 may be calculated given the permittivity of gate insulator layer 310, thickness 345 of gate insulator layer 310 and the permittivity of ferroelectric layer 315.

Gate insulator layer 310 and ferroelectric layer 315 are effectively two capacitors in series. The combined or system capacitance, $C_s$, across the two series capacitors is governed by the equation $C_s=(C_1 \times C_2)/(C_1+C_2)$ where $C_1$ is the capacitance of gate insulator layer 310 and $C_2$ is the capacitance of ferroelectric layer 315. The capacitance of each layer is a function of the permittivity of that layer and the thickness of that layer, and is defined as the permittivity multiplied by the surface area (as measured normal to the field lines of the applied electric field) and divided by the thickness (as measured parallel to the field lines of the applied electric field). Capacitance of each layer is thus governed by the equation $C_x=(\epsilon_x \times area_x)/thickness_x$ where x is 1 or 2 for gate insulator layer 310 or ferroelectric layer 315, respectively. Furthermore, as a series capacitance, the voltage drop appearing across each layer will be inversely proportional to its respective capacitance. Thus, the voltage drop across gate insulator layer 310 $V_1$, is governed by the equation $V_1=(V_A \times C_2)/(C_1+C_2)$, where $V_A$ is the applied voltage across gate insulator layer 310 and ferroelectric layer 315. The voltage drop across ferroelectric layer 315, $V_2$, is similarly governed by the equation $V_2=(V_A \times C_1)/(C_1+C_2)$. Accordingly, one can calculate appropriate combinations of thickness 340 of ferroelectric layer 315 and thickness 345 of gate insulator layer 310 such that a voltage appearing across ferroelectric layer 315 is sufficient for programming without exceeding a breakdown voltage across gate insulator layer 310. Sufficient programming voltage is a voltage resulting in a voltage drop across ferroelectric layer 315 that exceeds the coercive field of the weak ferroelectric material multiplied by the thickness 340 of ferroelectric layer 315.

The low values of spontaneous polarization of the weak ferroelectric materials described herein permit effective transistor operation without the need for a programming conductor interposed between the ferroelectric layer and the gate insulator layer. This is possible because effective programming voltages can be applied across the ferroelectric layer and the gate insulator layer in series without exceeding the breakdown voltage of the gate insulator layer. Thus, ferroelectric field effect transistors as described herein can be programmed without utilizing conduction paths through the transistor that are unnecessary for transistor operation. Furthermore, ferroelectric field effect transistors as described herein permit interposing a gate insulator layer between the substrate and the ferroelectric material to eliminate the undesirable surface interfaces and surface states resulting from a silicon substrate-ferroelectric interface.

The polarization state of ferroelectric layer 315 can be sensed by using a gate voltage having a magnitude less than the programming voltage and sensing the conductivity of the transistor from the source region to the drain region. Distinctly different conductivity states will exist depending on the polarization state of the ferroelectric layer due to the change in the threshold voltage of the field effect transistor. The transistor thus can function as an electrically-alterable programmable read-only memory (EAPROM) device. EAPROM devices can replace not only flash memory and electrically-erasable programmable read-only memory (EEPROM) devices, but also dynamic random access memory (DRAM) and static random access memory (SRAM). They can be used in programmable logic arrays (PLAs) and memory address and correction decode circuits. Such devices can further perform both memory and logic functions, as well as programmable logic functions.

One embodiment of a memory utilizing weak ferroelectric materials includes a memory array having a large number of memory cells arranged in blocks. Each of the memory cells is fabricated as a field effect transistor having a ferroelectric layer in the gate stack overlying a gate insulator layer. The ferroelectric layer is capable of polarization, and is separated, by the gate insulator layer, from source and drain regions contained in a substrate. Each of the memory cells can be electrically programmed (polarized) by applying a programming voltage across the ferroelectric layer such as from the upper conductor layer to a source and/or drain region. The polarization can be reversed on the ferroelectric layer by applying a programming voltage of an opposite polarity. Thus the data in a memory cell is determined by the polarization state of the ferroelectric layer.

MEMORY DEVICES

Figure 4:
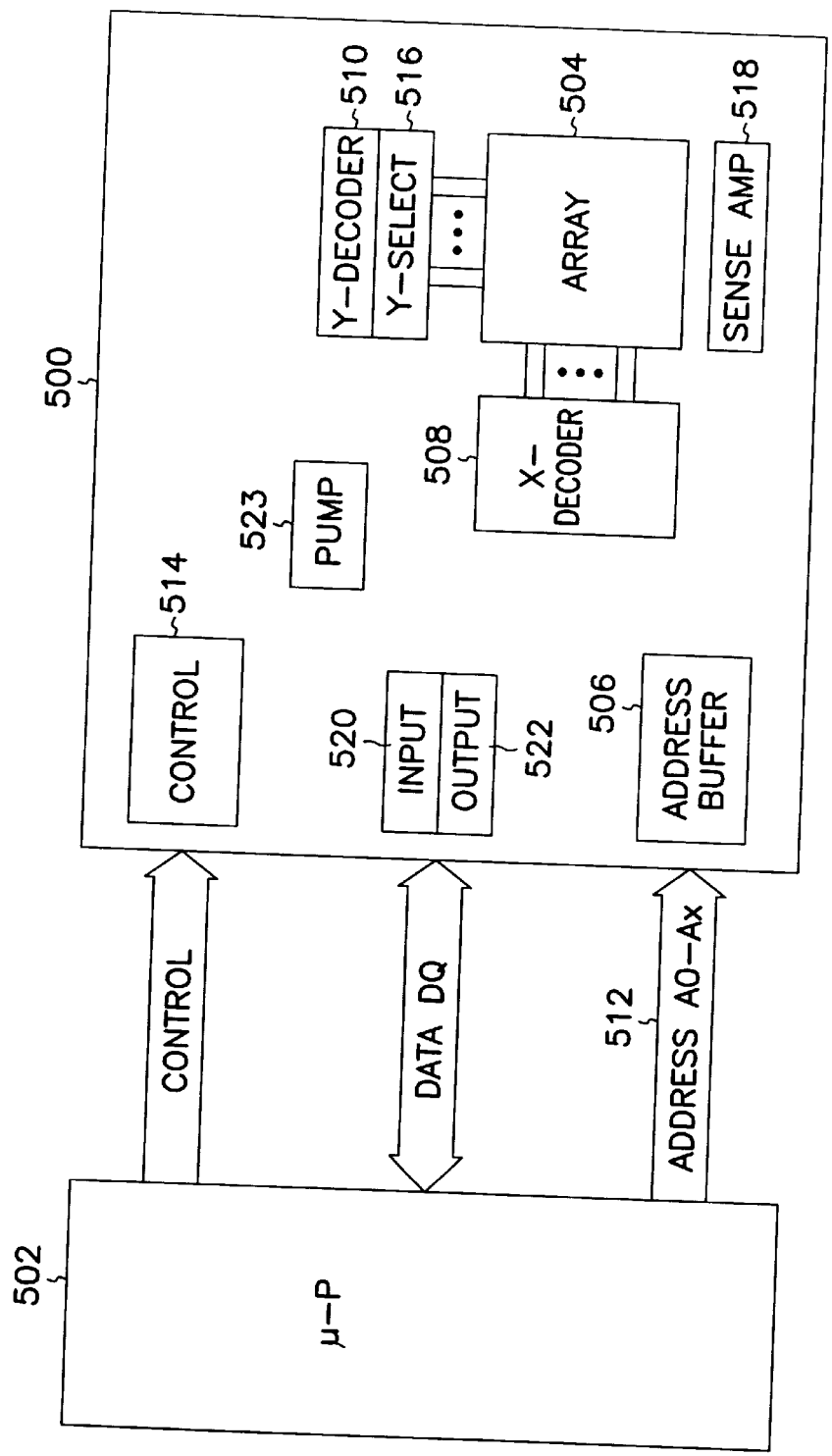
FIG. 4 is a block diagram of one embodiment of an integrated circuit memory device.

FIG. 4 is a block diagram of a programmable memory device 500 which is coupled to a data controller 502. The memory device has been simplified to focus on features of the memory which are helpful in understanding the invention. The memory device 500 includes an array 504 of memory cells. The memory cells include at least one ferroelectric field effect transistor of the invention. The array is arranged in rows and columns, with the rows arranged in blocks. The blocks allow memory cells to be erased in large groups, or bytes, as is well known to those skilled in the art. Data, however, can be stored in the memory array in small data groups (byte or group of bytes) and separate from the block structure. Erase operations are typically performed on a large number of cells in parallel.

An x-decoder, or row decoder, 508 and a y-decoder, or column decoder, 510 are provided to decode address signals provided on address lines 512. Address signals are received and decoded to access the memory array 504. An address buffer circuit 506 is provided to latch the address signals. A y-select circuit 516 is provided to select a column of the array identified with the y-decoder 510. Sense amplifier and compare circuitry 518 is used to sense data stored in the memory cells and verify the accuracy of stored data. Data input 520 and output 522 buffer circuits are included for bi-directional data communication over a plurality of data (DQ) lines with the controller 502. Command control circuit 514 decodes signals provided on control lines from the controller 502. These signals are used to control the operations of the memory, including data read, data write, and erase operations. The memory device 500 can include a charge pump circuit 523 to generate a VDD voltage used during programming of the memory cells and other internal operations.

As stated above, the memory device of FIG. 4 has been simplified to facilitate a basic understanding of the features of the memory. It will be appreciated that more than one programmable memory device can be included in various package configurations. For example, programmable memory modules can be manufactured in varying densities using one or more programmable memory devices.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

SEMICONDUCTOR DIES

Figure 5:
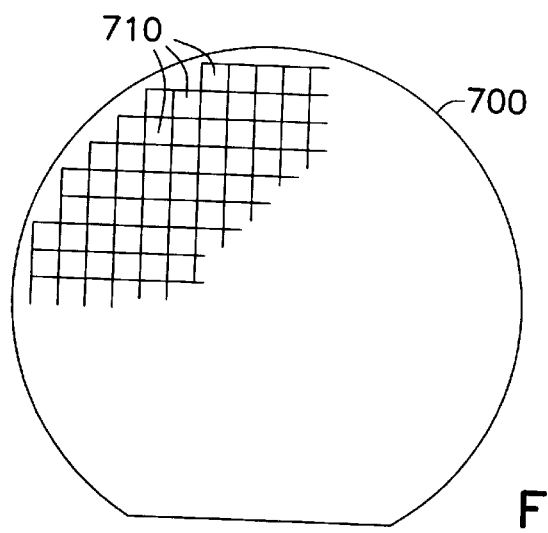
FIG. 5 is an elevation view of one embodiment of a wafer containing semiconductor dies.

With reference to FIG. 5, in one embodiment, a semiconductor die 710 is produced from a wafer 700. A die is an individual pattern, typically rectangular, on a substrate that contains circuitry, or integrated circuit devices, to perform a specific function. At least one of the integrated circuit devices is a ferroelectric field effect transistor in accordance with the invention. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

CIRCUIT MODULES

Figure 6:
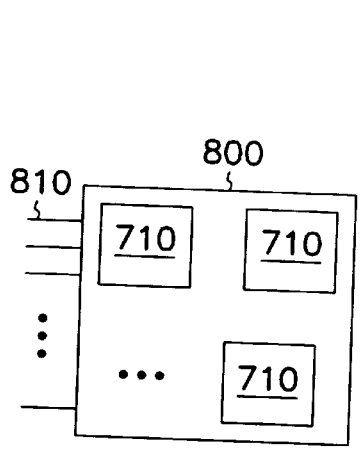
FIG. 6 is a block diagram of one embodiment of an exemplary circuit module.

As shown in FIG. 6, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contain at least one ferroelectric field effect transistor in accordance with the invention.

Some examples of a circuit module include memory modules, device drivers, power modules, communication modems, processor modules and application-specific modules, and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 7:
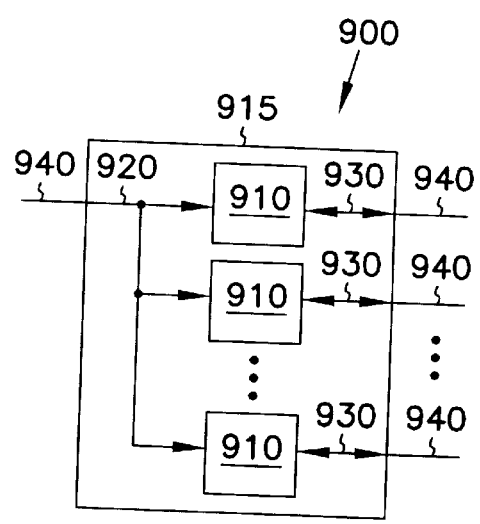
FIG. 7 is a block diagram of one embodiment of an exemplary memory module.

FIG. 7 shows one embodiment of a circuit module as memory module 900. Memory module 900 contains multiple memory devices 910 contained on support 915, the number depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 7.

ELECTRONIC SYSTEMS

Figure 8:
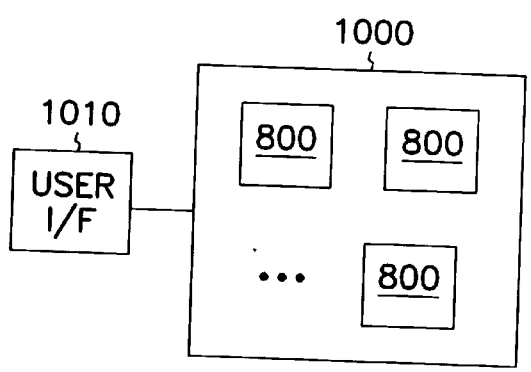
FIG. 8 is a block diagram of one embodiment of an exemplary electronic system.

FIG. 8 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 9:
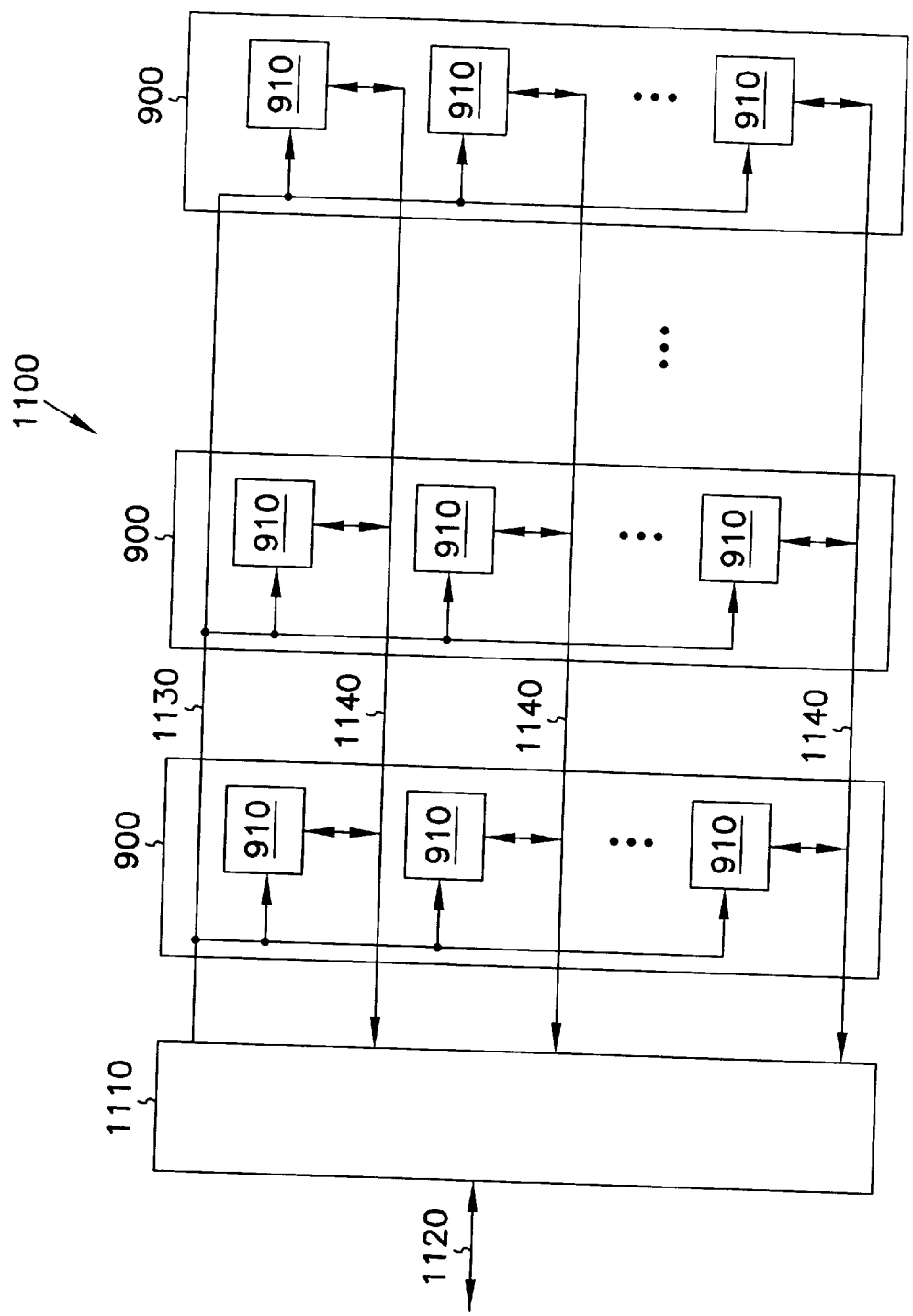
FIG. 9 is a block diagram of one embodiment of an exemplary memory system.

FIG. 9 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 10:
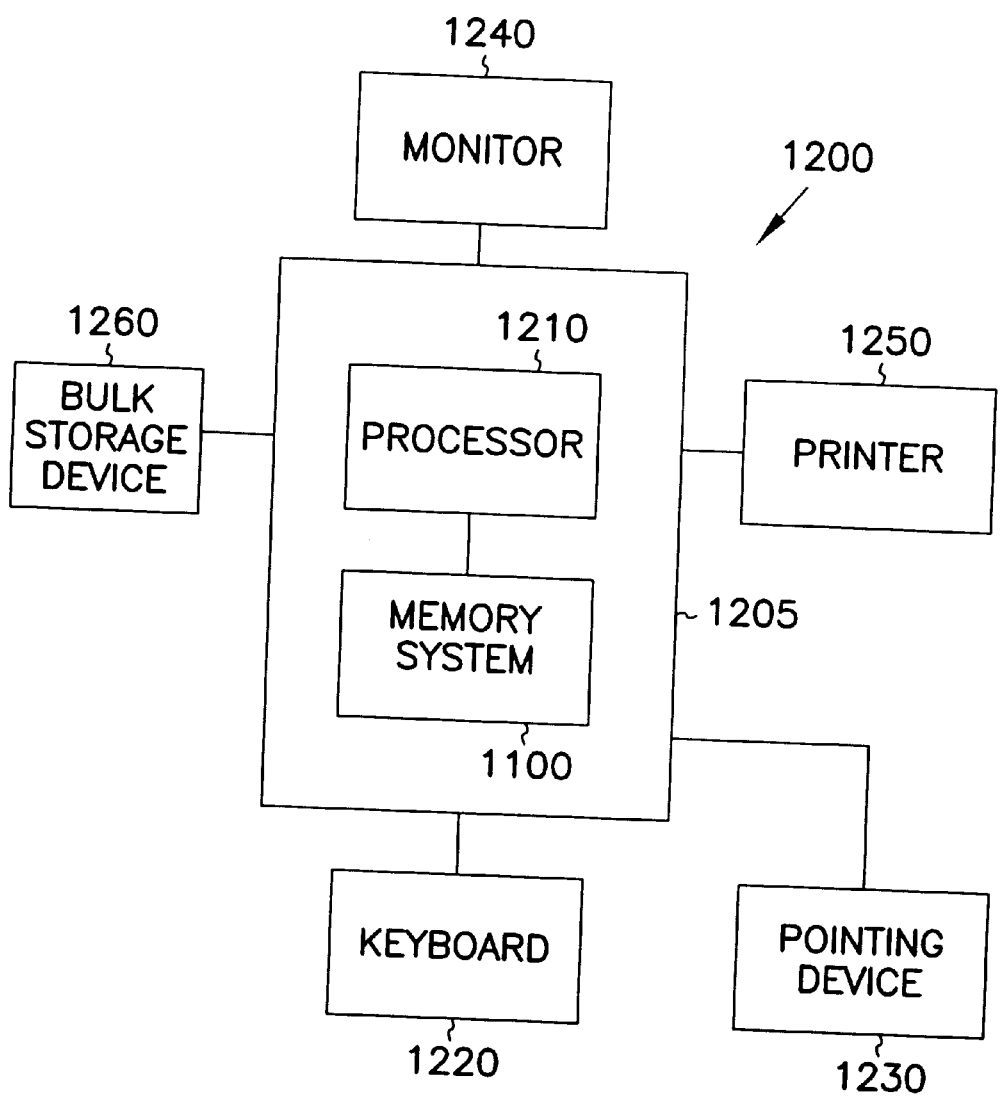
FIG. 10 is a block diagram of one embodiment of an exemplary computer system.

FIG. 10 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 10 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

CONCLUSION

Field effect transistors have been described having a ferroelectric layer overlying a gate insulator layer. Such ferroelectric field effect transistors are suitable for use in memory devices as the polarization of the ferroelectric layer can represent distinct logic states. The polarization of the ferroelectric layer alters the threshold voltage of the field effect transistor thus producing distinctly different conductivity states through the field effect transistor at a given gate potential depending upon the polarization. The ferroelectric layer may contain a weak ferroelectric material having spontaneous polarization values in the range of approximately 0.01 $\mu$Coulomb/cm$^2$ to 1 $\mu$Coulomb/cm$^2$. The ferroelectric layer may contain a doped zinc oxide material doped with lithium and/or magnesium. Such weak ferroelectric materials permit effective transistor operation without the need for a programming conductor interposed between the ferroelectric layer and the gate insulator layer. This is possible because effective programming voltages can be applied across the ferroelectric layer and the gate insulator layer in series without exceeding the breakdown voltage of the gate insulator layer. Furthermore, having a gate insulator layer interposed between a substrate and the ferroelectric material eliminates the undesirable surface interfaces and surface states resulting from a silicon substrate-ferroelectric interface.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other materials and shapes, as well as other deposition and removal processes, may be utilized in conjunction with the invention. Accordingly, this application is intended to cover any adaptations or variations of the invention. It is manifestly intended that this invention be limited only by the following claims and equivalents thereof.

What is claimed is:

1. A field effect transistor comprising:
    a gate insulator layer overlying a substrate; and
    a ferroelectric layer overlying and adjacent the gate insulator layer, wherein the ferroelectric layer comprises a weak ferroelectric material having a spontaneous polarization in the range of approximately 0.01 $\mu$Coulomb/cm$^2$ to approximately 1 $\mu$Coulomb/cm$^2$,
    wherein the gate insulator layer and the ferroelectric layer each have a thickness and wherein the thickness of the ferroelectric layer is approximately 10 times the thickness of the gate insulator layer.

2. The field effect transistor of claim 1, wherein the gate insulator layer and the ferroelectric layer each have a thickness and wherein the thickness of the ferroelectric layer is less than approximately 10,000 Å and the thickness of the gate insulator layer is less than approximately 1,000 Å.

3. The field effect transistor of claim 1, wherein the thickness of at least one of the gate insulator layer and the ferroelectric layer is adjusted such that a programming voltage applied across the gate insulator layer and the ferroelectric layer in series is sufficient to polarize the ferroelectric layer without exceeding a breakdown voltage of the gate insulator layer.

4. The field effect transistor of claim 1, further comprising:
    a source region in the substrate,
    a drain region in the substrate and separated from the source region by a channel region; and
    an upper conductor layer overlying the ferroelectric layer;
    wherein a programming voltage applied across the upper conductor layer to a region selected from the group consisting of the source region and the drain region is capable of polarizing the weak ferroelectric material, thereby producing a polarization state in the ferroelectric layer; and
    wherein a second voltage having a lower magnitude than the programming voltage and applied to the upper conductor layer is capable of producing distinctly different conductivity states between the source region and the drain region in response to the polarization state of the ferroelectric layer.

5. A field effect transistor, comprising:
    a gate insulator layer overlying a substrate; and
    a ferroelectric layer overlying the gate insulator layer and without a programming conductor interposed between the ferroelectric layer and the gate insulator layer, wherein the ferroelectric layer comprises a weak ferroelectric material having a spontaneous polarization in the range of approximately 0.01 $\mu$Coulomb/cm$^2$ to approximately 1 $\mu$Coulomb/cm$^2$,
    wherein the gate insulator layer and the ferroelectric layer each have a thickness and wherein the thickness of the ferroelectric layer is 10 times the thickness of the gate insulator layer.

6. A field effect transistor, comprising:
    a gate insulator layer overlying a substrate; and
    a ferroelectric layer overlying and adjacent the gate insulator layer, wherein the ferroelectric layer comprises a doped zinc oxide material having a general formula of $Zn_xLi_{1-x}O$ where x ranges from approximately 0.70 to approximately 0.99,
    wherein the gate insulator layer and the ferroelectric layer each have a thickness and wherein the thickness of the ferroelectric layer is greater than the thickness of the gate insulator layer.

7. A field effect transistor, comprising:
    a gate insulator layer overlying a substrate; and
    a ferroelectric layer overlying the gate insulator layer and without a programming conductor interposed between the ferroelectric layer and the gate insulator layer, wherein the ferroelectric layer comprises a doped zinc oxide material having a general formula of $Zn_xLi_{1-x}O$ where x ranges from approximately 0.70 to approximately 0.99,
    wherein the gate insulator layer and the ferroelectric layer each have a thickness and wherein the thickness of the ferroelectric layer is greater than the thickness of the gate insulator layer.

8. A field effect transistor, comprising:
    a gate insulator layer overlying a substrate; and
    a ferroelectric layer overlying and adjacent the gate insulator layer, wherein the ferroelectric layer comprises a doped zinc oxide material having a general formula of $Zn_xMg_{1-x}O$ where x ranges from approximately 0.70 to approximately 0.99,
    wherein the gate insulator layer and the ferroelectric layer each have a thickness and wherein the thickness of the ferroelectric layer is greater than the thickness of the gate insulator layer.

9. A field effect transistor, comprising:
    a gate insulator layer overlying a substrate; and
    a ferroelectric layer overlying the gate insulator layer and without a programming conductor interposed between the ferroelectric layer and the gate insulator layer, wherein the ferroelectric layer comprises a doped zinc oxide material having a general formula of $Zn_xMg_{1-x}O$ where x ranges from approximately 0.70 to approximately 0.99,
    wherein the gate insulator layer and the ferroelectric layer each have a thickness and wherein the thickness of the ferroelectric layer is greater than the thickness of the gate insulator layer.

10. A field effect transistor, comprising:
a gate insulator layer overlying a substrate; and
a ferroelectric layer overlying and adjacent the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30, wherein the gate insulator layer and the ferroelectric layer each have a thickness and wherein the thickness of tie ferroelectric layer is greater than the thickness of the gate insulator layer.

11. The field effect transistor of claim 10, wherein the gate insulator layer and the ferroelectric layer each have a thickness and wherein the thickness of the ferroelectric layer is approximately 10 times the thickness of the gate insulator layer.

12. The field effect transistor of claim 10, wherein the gate insulator layer and the ferroelectric layer each have a thickness and wherein the thickness of the ferroelectric layer is at least 5 times the thickness of the gate insulator layer.

13. The field effect transistor of claim 10, wherein the gate insulator layer and the ferroelectric layer each have a thickness and wherein the thickness of the ferroelectric layer is less than approximately 10,000 Å and the thickness of the gate insulator layer is less than approximately 1,000 Å.

14. The field effect transistor of claim 10, wherein the thickness of at least one of the gate insulator layer and the ferroelectric layer is adjusted such that a programming voltage applied across the gate insulator layer and the ferroelectric layer in series is sufficient to polarize the ferroelectric layer without exceeding a breakdown voltage of the gate insulator layer.

15. The field effect transistor of claim 10, further comprising:
a source region in the substrate;
a drain region in the substrate and separated from the source region by a channel region; and
an upper conductor layer overlying the ferroelectric layer;
wherein a programming voltage applied across the upper conductor layer to a region selected from the group consisting of the source region and the drain region is capable of polarizing the weak ferroelectric material, thereby producing a polarization state in the ferroelectric layer; and
wherein a second voltage having a lower magnitude than the programming voltage and applied to the upper conductor layer is capable of producing distinctly different conductivity states between the source region and the drain region in response to the polarization state of the ferroelectric layer.

16. A field effect transistor, comprising:
a gate insulator layer overlying a substrate; and
a ferroelectric layer overlying the gate insulator layer and without a programming conductor interposed between the ferroelectric layer and the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30,
wherein the gate insulator layer and the ferroelectric layer each have a thickness and wherein the thickness of the ferroelectric layer is greater than the thickness of the gate insulator layer.

17. A semiconductor die, comprising:
an integrated circuit supported by a substrate and having a plurality of integrated circuit devices, wherein at least one of the plurality of integrated circuit devices is a field effect transistor, the field effect transistor comprising:
a gate insulator layer overlying a substrate; and
a ferroelectric layer overlying and adjacent the gate insulator layer, wherein the ferroelectric layer comprises a weak ferroelectric material having a spontaneous polarization in the range of approximately 0.01 $\mu Coulomb/cm^2$ to approximately 1 $\mu Coulomb/cm^2$,
wherein the gate insulator layer and the ferroelectric layer each have a thickness and wherein the thickness of the ferroelectric layer is greater than the thickness of the gate insulator layer.

18. The semiconductor die of claim 17, wherein is adjusted such that a programming voltage applied across the gate insulator layer and the ferroelectric layer in series is sufficient to polarize the ferroelectric layer without exceeding a breakdown voltage of the gate insulator layer.

19. The semiconductor die of claim 17, wherein the field effect transistor further comprises:
a source region in the substrate,
a drain region in the substrate and separated from the source region by a channel region; and
an upper conductor layer overlying the ferroelectric layer;
wherein a programming voltage applied across the upper conductor layer to a region selected from the group consisting of the source region and the drain region is capable of polarizing the weak ferroelectric material, thereby producing a polarization state in the ferroelectric layer; and
wherein a second voltage having a lower magnitude than the programming voltage and applied to the upper conductor layer is capable of producing distinctly different conductivity states between the source region and the drain region in response to the polarization state of the ferroelectric layer.

20. A semiconductor die, comprising:
an integrated circuit supported by a substrate and having a plurality of integrated circuit devices, wherein at least one of the plurality of integrated circuit devices is a field effect transistor, the field effect transistor comprising:
a gate insulator layer overlying a substrate; and
a ferroelectric layer overlying the gate insulator layer and without a programming conductor interposed between the ferroelectric layer and the gate insulator layer, wherein the ferroelectric layer comprises a weak ferroelectric material having a spontaneous polarization in the range of approximately 0.01 $\mu Coulomb/cm^2$ to approximately 1 $\mu Coulomb/cm^2$,
wherein the gate insulator layer and the ferroelectric layer each have a thickness and wherein the thickness of the ferroelectric layer is greater than the thickness of the gate insulator layer.

21. A semiconductor die, comprising;
an integrated circuit supported by a substrate and having a plurality of integrated circuit devices, wherein at least one of the plurality of integrated circuit devices is a field effect transistor, the field effect transistor comprising:

a gate insulator layer overlying a substrate; and a ferroelectric layer overlying and adjacent the gate insulator layer, wherein the ferroelectric layer comprises a doped zinc oxide material having a general formula of $Zn_xLi_{1-x}O$ where x ranges from approximately 0.70 to approximately 0.99, wherein the gate insulator layer and the feoelectric layer each have a thickness and wherein the thickness of the ferroelectric layer is greater than the thickness of the gate insulator layer.

22. A semiconductor die, comprising:

an integrated circuit supported by a substrate and having a plurality of integrated circuit devices, wherein at least one of the plurality of integrated circuit devices is a field effect transistor, the field effect transistor comprising:

a gate insulator layer overlying a substrate; and a ferroelectric layer overlying the gate insulator layer and without a programming conductor interposed between the ferroelectric layer and the gate insulator layer, wherein the ferroelectric layer comprises a doped zinc oxide material having a general formula of $Zn_xLi_{1-x}O$ where x ranges from approximately 0.70 to approximately 0.99, wherein the gate insulator layer and the ferroelectric layer each have a thickness and wherein the thickness of the ferroelectric layer is greater than the thickness of the gate insulator layer.

23. A semiconductor die, comprising:

an integrated circuit supported by a substrate and having a plurality of integrated circuit devices, wherein at least one of the plurality of integrated circuit devices is a field effect transistor, the field effect transistor comprising:

a gate insulator layer overlying a substrate; and a ferroelectric layer overlying and adjacent the gate insulator layer, wherein the ferroelectric layer comprises a doped zinc oxide material having a general formula of $Zn_xMg_{1-x}O$ where x ranges from approximately 0.70 to approximately 0.99, wherein the gate insulator layer and the ferroelectric layer each have a thickness and wherein the thickness of the ferroelectric layer is greater than the thickness of the gate insulator layer.

24. A semiconductor die, comprising:

an integrated circuit supported by a substrate and having a plurality of integrated circuit devices, wherein at least one of the plurality of integrated circuit devices is a field effect transistor, the field effect transistor comprising:

a gate insulator layer overlying a substrate; and a ferroelectric layer overlying the gate insulator layer and without a programming conductor interposed between the ferroelectric layer and the gate insulator layer, wherein the ferroelectric layer comprises a doped zinc oxide material having a general formula of $Zn_xMg_{1-x}O$ where x ranges from approximately 0.70 to approximately 0.99, wherein the gate insulator layer and the ferroelectric layer each have a thickness and wherein the thickness of the ferroelectric layer is approximately 10 times the thickness of the gate insulator layer.

25. A semiconductor die, comprising:

an integrated circuit supported by a substrate and having a plurality of integrated circuit devices, wherein at least one of the plurality of integrated circuit devices is a field effect transistor, the field effect transistor comprising:

a gate insulator layer overlying a substrate; and a ferroelectric layer overlying and adjacent the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30, wherein the gate insulator layer and the ferroelectric layer each have a thickness and wherein the thickness of the ferroelectric layer is greater than the thickness of the gate insulator layer.

26. The semiconductor die of claim 25, wherein the gate insulator layer and the ferroelectric layer of the field effect transistor each have a thickness and wherein the thickness of the gate insulator layer and the ferroelectric layer are adjusted such that a programming voltage applied across the gate insulator layer and the ferroelectric layer in series is sufficient to polarize the ferroelectric layer without exceeding a breakdown voltage of the gate insulator layer.

27. The semiconductor die of claim 25, wherein the field effect transistor farther comprises:

a source region in the substrate;

a drain region in the substrate and separated from the source region by a channel region; and an upper conductor layer overlying the ferroelectric layer;

wherein a programming voltage applied across the upper conductor layer to a region selected from the group consisting of the source region and the drain region is capable of polarizing the weak ferroelectric material, thereby producing a polarization state in the ferroelectric layer; and wherein a second voltage having a lower magnitude than the programming voltage and applied to the upper conductor layer is capable of producing distinctly different conductivity states between the source region and the drain region in response to the polarization state of the ferroelectric layer.

28. A semiconductor die, comprising:

an integrated circuit supported by a substrate and having a plurality of integrated circuit devices, wherein at least one of the plurality of integrated circuit devices is a field effect transistor, the field effect transistor comprising:

a gate insulator layer overlying a substrate; and a ferroelectric layer overlying the gate insulator layer and without a programming conductor interposed between the ferroelectric layer and the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30, wherein the gate insulator layer and the ferroelectric layer each have a thickness and wherein the thickness of the ferroelectric layer is greater than the thickness of the gate insulator layer.

29. A memory device, comprising:

an array of memory cells, wherein at least one memory cell comprises a field effect transistor, the field effect transistor comprising:

a gate insulator layer overlying a substrate; and a ferroelectric layer overlying and adjacent the gate insulator layer, wherein the ferroelectric layer comprises a weak ferroelectric material having A spontaneous polarization in the range of approximately 0.01 μCoulomb/cm² to approximately 1 μCoulomb/cm², wherein the gate insulator layer and the ferroelectric layer each have a thickness and wherein the thickness of the ferroelectric layer is greater than the thickness of the gate insulator layer;

a row access circuit coupled to the array of memory cells;

a column access circuit coupled to the array of memory cells; and an address decoder circuit coupled to the row access circuit and the column access circuit.

30. The memory device of claim 29, wherein the gate insulator layer and the ferroelectric layer of the field effect transistor each have a thickness and wherein the thickness of the gate insulator layer and the ferroelectric layer are adjusted such that a programming voltage applied across the gate insulator layer and the ferroelectric layer in series is sufficient to polarize the ferroelectric layer without exceeding a breakdown voltage of the gate insulator layer.

31. The memory device of claim 29, wherein the field effect transistor further comprises:

a source region in the substrate;

a drain region in the substrate and separated from the source region by a channel region; and an upper conductor layer overlying the ferroelectric layer;

wherein a programming voltage applied across the upper conductor layer to a region selected from the group consisting of the source region and the drain region is capable of polarizing the weak ferroelectric material, thereby producing a polarization state in the ferroelectric layer; and wherein a second voltage having a lower magnitude than the programming voltage and applied to the upper conductor layer is capable of producing distinctly different conductivity states between the source region and the drain region in response to the polarization state of the ferroelectric layer.

32. A memory device, comprising:

an array of memory cells, wherein at least one memory cell composes a field effect transistor, the field effect transistor comprising:

a gate insulator layer overlying a substrate; and a ferroelectric layer overlying the gate insulator layer and without a programming conductor interposed between the ferroelectric layer and the gate insulator layer, wherein the ferroelectric layer comprises a weak ferroelectric material having a spontaneous polarization in the range of approximately 0.01 μCoulomb/cm² to approximately 1 μCoulomb/cm², wherein the gate insulator layer and the ferroelectric layer each have a thickness and wherein the thickness of the ferroelectric layer is 10 times greater than the thickness of the gate insulator layer;

a row access circuit coupled to the array of memory cells;

a column access circuit coupled to the array of memory cells; and an address decoder circuit coupled to the row access circuit and the column access circuit.

33. A memory device, comprising;

an array of memory cells, wherein at least one memory cell comprises a field effect transistor, the field effect transistor comprising:

a gate insulator layer overlying a substrate; and a ferroelectric layer overlying and adjacent the gate insulator layer, wherein the ferroelectric layer comprises a doped zinc oxide material having a general formula of $Zn_x(Li_yMg_z)O$ where, x ranges from approximately 0.70 to approximately 0.99, y and z each independently range from approximately 0.00 to approximately 0.30 and the sum of y+z ranges from approximately 0.01 to approximately 0.30, wherein the gate insulator layer and the ferroelectric layer each have a thickness and wherein the thickness of the ferroelectric layer is 10 times greater than the thickness of the gate insulator layer;

a row access circuit coupled to the array of memory cells;

a column access circuit coupled to the array of memory cells; and an address decoder circuit coupled to the row access circuit and the column access circuit.

34. The memory device of claim 33, wherein the gate insulator layer and the ferroelectric layer of the field effect transistor each have a thickness and wherein the thickness of the gate insulator layer and the ferroelectric layer are adjusted such that a programming voltage applied across the gate insulator layer and the ferroelectric layer in series is sufficient to polarize the ferroelectric layer without exceeding a breakdown voltage of the gate insulator layer.

35. The memory device of claim 33, wherein the field effect transistor further comprises:

a source region in the substrate;

a drain region in the substrate and separated from the source region by a channel region; and an upper conductor layer overlying the ferroelectric layer;

wherein a programming voltage applied across the upper conductor layer to a region selected from the group consisting of the source region and the drain region is capable of polarizing the weal ferroelectric material, thereby producing a polarization state in the ferroelectric layer; and wherein a second voltage having a lower magnitude than the programming voltage and applied to the upper conductor layer is capable of producing distinctly different conductivity states between the source region and the drain region in response to the polarization state of the ferroelectric layer.

36. A memory device, comprising:

an array of memory cells, wherein at least one memory cell comprises a field effect transistor, the field effect transistor comprising:

a gate insulator layer overlying a substrate; and a ferroelectric layer overlying the gate insulator layer and without a programming conductor interposed between the ferroelectric layer and the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30, wherein the gate insulator layer and the ferroelectric layer each have a thickness and wherein the thickness of the ferroelectric layer is 10 times greater than the thickness of the gate insulator layer;

a row access circuit coupled to the array of memory cells;

a column access circuit coupled to the array of memory cells; and an address decoder circuit coupled to the row access circuit and the column access circuit.

37. A memory module, comprising:

a support;

a plurality of leads extending from the support;

a command link coupled to at least one of the plurality of leads;

a plurality of data links, wherein each data link is coupled to at least one of the plurality of leads; and at least one memory device contained on the support and coupled to the command link, wherein the at least one memory device comprises:
an array of memory cells, wherein at least one memory cell comprises a field effect transistor, the field effect transistor comprising:
a gate insulator layer overlying a substrate; and
a ferroelectric layer overlying and adjacent the gate insulator layer, wherein the ferroelectric layer comprises a weak ferroelectric material having a spontaneous polarization in the range of approximately 0.01 $\mu$Coulomb/cm$^2$ to approximately 1 $\mu$Coulomb/cm$^2$,
wherein the gate insulator layer and the ferroelectric layer each have a thickness and wherein the thickness of the ferroelectric layer is 10 times greater than the thickness of the gate insulator layer;
a row access circuit coupled to the array of memory cells;
a column access circuit coupled to the array of memory cells; and an address decoder circuit coupled to the row access circuit and the column access circuit.

38. A memory module, comprising:

a support;

a plurality of leads extending from the support;

a command link coupled to at least one of the plurality of leads; a plurality of data links, wherein each data link is coupled to at least one of the plurality of leads; and at least one memory device contained on the support and coupled to the command link, wherein the at least one memory device comprises:
an array of memory cells, wherein at least one memory cell comprises a field effect transistor, the field effect transistor comprising:
a gate insulator layer overlying a substrate; and
a ferroelectric layer overlying the gate insulator layer and without a programming conductor interposed between the ferroelectric layer and the gate insulator layer, wherein the ferroelectric layer comprises a weak ferroelectric material having a spontaneous polarization in the range of approximately 0.01 $\mu$Coulomb/cm$^2$ to approximately 1 $\mu$Coulomb/cm$^2$,
wherein the gate insulator layer and the ferroelectric layer each have a thickness and wherein the thickness of the ferroelectric layer is 10 times greater than the thickness of the gate insulator layer;
a row access circuit coupled to the array of memory cells;
a column access circuit coupled to the array of memory cells; and
an address decoder circuit coupled to the row access circuit and the column access circuit.

39. A memory module, comprising:

a support;

a plurality of leads extending from the support;

a command link coupled to at least one of the plurality of leads;

a plurality of data links, wherein each data link is coupled to at least one of the plurality of leads; and at least one memory device contained on the support and coupled to the command link, wherein the at least one memory device comprises:
an array of memory cells, wherein at least one memory cell comprises a field effect transistor, the field effect transistor comprising:
a gate insulator layer overlying a substrate; and
a ferroelectric layer overlying and adjacent the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30,
wherein the gate insulator layer and the ferroelectric layer each have a thickness and wherein the thickness of the ferroelectric layer is greater than the thickness of the gate insulator layer;
a row access circuit coupled to the array of memory cells;
a column access circuit coupled to the array of memory cells; and
an address decoder circuit coupled to the row access circuit and the column access circuit.

40. A memory module, comprising:

a support;

a plurality of leads extending from the support;

a command link coupled to at least one of the plurality of leads;

a plurality of data links, wherein each data link is coupled to at least one of the plurality of leads; and at least one memory device contained on the support and coupled to the command link, wherein the at least one memory device comprises:
an array of memory cells, wherein at least one memory cell comprises a field effect transistor, the field effect transistor comprising:
a gate insulator layer overlying a substrate; and
a ferroelectric layer overlying the gate insulator layer and without a programming conductor interposed between the ferroelectric layer and the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30,
wherein the gate insulator layer and the ferroelectric layer each have a thickness and wherein the thickness of the ferroelectric layer is greater than the thickness of the gate insulator layer;
a row access circuit coupled to the array of memory cells;
a column access circuit coupled to the array of memory cells; and
an address decoder circuit coupled to the row access circuit and the column access circuit.

41. An electronic system, comprising:

a processor; and a circuit module having a plurality of leads coupled to the processor, and further having a semiconductor die coupled to the plurality of leads, wherein the semiconductor die comprises:
  an integrated circuit supported by a substrate and having a plurality of integrated circuit devices, wherein at least one of the plurality of integrated circuit devices is a field effect transistor, the field effect transistor comprising:
    a gate insulator layer overlying a substrate; and
    a ferroelectric layer overlying and adjacent the gate insulator layer, wherein the ferroelectric layer comprises a weak ferroelectric material having a spontaneous polarization in the range of approximately 0.01 $\mu$Coulomb/cm$^2$ to approximately 1 $\mu$Coulomb/cm$^2$,
    wherein the gate insulator layer and the ferroelectric layer each have a thickness and wherein the thickness of the ferroelectric layer is greater then the thickness of the gate insulator layer.

42. An electronic system, comprising:
a processor; and
a circuit module having a plurality of leads coupled to the processor, and further having a semiconductor die coupled to the plurality of leads, wherein the semiconductor die comprises:
  an integrated circuit supported by a substrate and having a plurality of integrated circuit devices, wherein at least one of the plurality of integrated circuit devices is a field effect transistor, the field effect transistor comprising:
    gate insulator layer overlying a substrate; and
    a ferroelectric layer overlying the gate insulator layer and without a programming conductor interposed between the feoelectric layer and the gate insulator layer, wherein the ferroelectric layer comprises a weak ferroelectric material having a spontaneous polarization in the range of approximately 0.01 $\mu$Coulomb/cm$^2$ to approximately 1 $\mu$Coulomb/cm$^2$,
    wherein the gate insulator layer and the ferroelectric layer each have a thickness and wherein the thickness of the ferroelectric layer greater than the thickness of the gate insulator layer.

43. An electronic system, comprising:
a processor; and
a circuit module having a plurality of leads coupled to the processor, and further having a semiconductor die coupled to the plurality of leads, wherein the semiconductor die comprises:
  an integrated circuit supported by a substrate and having a plurality of integrated circuit devices, wherein at least one of the plurality of integrated circuit devices is a field effect transistor, the field effect transistor comprising:
    a gate insulator layer overlying a substrate; and
    a ferroelectric layer overlying and adjacent the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30,
    wherein the gate insulator layer and the ferroelectric layer each have a thickness and wherein the thickness of the ferroelectric layer is 10 times greater than the thickness of the gate insulator layer.

44. An electronic system, comprising:
a processor; and
a circuit module having a plurality of leads coupled to the processor, and further having a semiconductor die coupled to the plurality of leads, wherein the semiconductor die comprises:
  an integrated circuit supported by a substrate and having a plurality of integrated circuit devices, wherein at least one of the plurality of integrated circuit devices is a field effect transistor, the field effect transistor comprising;
    a gate insulator layer overlying a substrate; and
    a ferroelectric layer overlying the gate insulator layer and without a programming conductor interposed between the ferroelectric layer and the gate insulator layer, wherein the ferroelectric layer comprises a doped zinc oxide material having a general formula of $Zn_x(Li_yMg_z)O$ where x ranges from approximately 0.70 to approximately 0.99, y and z each independently range from approximately 0.00 to approximately 0.30 and the sum of y+z ranges from approximately 0.01 to approximately 0.30,
    wherein the gate insulator layer and the ferroelectric layer each have a thickness and wherein the thickness of the ferroelectric layer is 10 times greater than the thickness of the gate insulator layer.

* * * * *

UNITED STATES PATENT AND TRADEMARK OFFICE
CERTIFICATE OF CORRECTION

PATENT NO. : 6,498,362 B1
DATED : December 24, 2002
INVENTOR(S) : Leonard Forbes and Kie Y. Ahn It is certified that error appears in the above-identified patent and that said Letters Patent is hereby corrected as shown below:

Title page,
Item [56], OTHER PUBLICATIONS, delete "Funcations" and insert -- Functions --, therefor.

Column 6,
Line 36, delete "))" before "as" and insert -- )O --, therefor.

Column 7,
Lines 12-13, delete "$Zn_xMg_{1-x}O$" and insert -- $Zn_xLi_{1-x}O$ --, therefor.

Column 9,
Line 31, delete "." Before "as".
Line 34, insert -- , -- after "310".

Column 10,
Line 62, delete "VDD" and insert -- $V_{DD}$ --, therefor.

Column 15,
Line 12, delete "tie" and insert -- the --, therefor.

Column 17,
Line 7, delete "feoelectric" and insert -- ferroelectric --, therefor.

Column 19,
Line 43, delete "composes" and insert -- comprises --, therefor.
Line 61, delete ";" and insert -- : --, therefor.

Column 20,
Line 2, delete "," after "where".
Line 35, delete "weal" and insert -- weak --, therefor.

UNITED STATES PATENT AND TRADEMARK OFFICE
CERTIFICATE OF CORRECTION

PATENT NO. : 6,498,362 B1
DATED : December 24, 2002
INVENTOR(S) : Leonard Forbes and Kie Y. Ahn It is certified that error appears in the above-identified patent and that said Letters Patent is hereby corrected as shown below:

Column 23,
Line 33, delete "feoelectric" and insert -- ferroelectric --, therefor.

Signed and Sealed this

Twenty-second Day of July, 2003

JAMES E. ROGAN
*Director of the United States Patent and Trademark Office*